(12) United States Patent
Tseng et al.

(10) Patent No.: US 8,647,900 B2
(45) Date of Patent: Feb. 11, 2014

(54) MICRO-STRUCTURE PHOSPHOR COATING

(75) Inventors: Chi Xiang Tseng, Kaohsiung (TW); Hsiao-Wen Lee, Hsinchu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 519 days.

(21) Appl. No.: 12/885,892

(22) Filed: Sep. 20, 2010

(65) Prior Publication Data

US 2012/0068208 A1    Mar. 22, 2012

(51) Int. Cl.
*H01L 21/00*    (2006.01)

(52) U.S. Cl.
USPC ........... 438/27; 438/28; 257/98; 257/E33.067

(58) Field of Classification Search
USPC ................ 438/26–29; 257/98–100, E33.067, 257/E33.056
See application file for complete search history.

(56) References Cited

U.S. PATENT DOCUMENTS

| 6,682,331 B1 * | 1/2004 | Peh et al. ...................... 425/112 |
| 2010/0237775 A1 * | 9/2010 | Chao ............................. 313/506 |

\* cited by examiner

*Primary Examiner* — Chuong A Luu
*Assistant Examiner* — Nga Doan
(74) *Attorney, Agent, or Firm* — Haynes and Boone, LLP

(57) ABSTRACT

An optical emitter includes micro-structure phosphor coating on a light-emitting diode die mounted on a package substrate. The micro-structures are transferred onto a micro-structure phosphor coating precursor by patterning and curing the precursor or by curing the precursor through a mold. The micro-structures are half spheroids, three-sided pyramids, or six-sided pyramids.

20 Claims, 9 Drawing Sheets

MICRO-STRUCTURE PHOSPHOR COATING

TECHNICAL FIELD

The present disclosure relates generally to a semiconductor device, and more particularly, to a semiconductor light-emitting diode (LED).

BACKGROUND

A Light-Emitting Diode (LED), as used herein, is a semiconductor light source for generating light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction.

A phosphor material is usually added to change the properties of light generated by the LED. For example, monochromatic light provided by an LED can be converted to polychromatic light through the application of several phosphors, either in a mixture or several phosphor layers. The phosphors Stokes shift a shorter wavelength light to a longer wavelength. The perception of white light may be evoked by generating mixtures of wavelengths that stimulate all three types of color sensitive cone cells (red, green, and blue) in the human eye in nearly equal amounts and with high brightness compared to the surroundings in a process called additive mixing. A white light LED may be used as lighting, such as back lighting for various display devices, commonly in conjunction with a liquid crystal display (LCD).

LEDs are made by growing a plurality of light-emitting structures on a substrate. When separated, the light-emitting structures are referred to as LED dies. Electrodes or conductive pads, reflectors, lenses, packaging substrate, and optionally one or more phosphor materials are combined with the plurality of light-emitting structure to create optical emitters. The phosphor material is typically dispensed on a LED die that is attached to a package substrate. In some cases, the phosphor material is coated on the LED die in a uniform thickness coating.

While existing methods of packaging an LED have been generally adequate for their intended purposes, they have not been entirely satisfactory in every aspect. More efficient methods and designs that extract more of the light generated and improve light and color distribution continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1A:
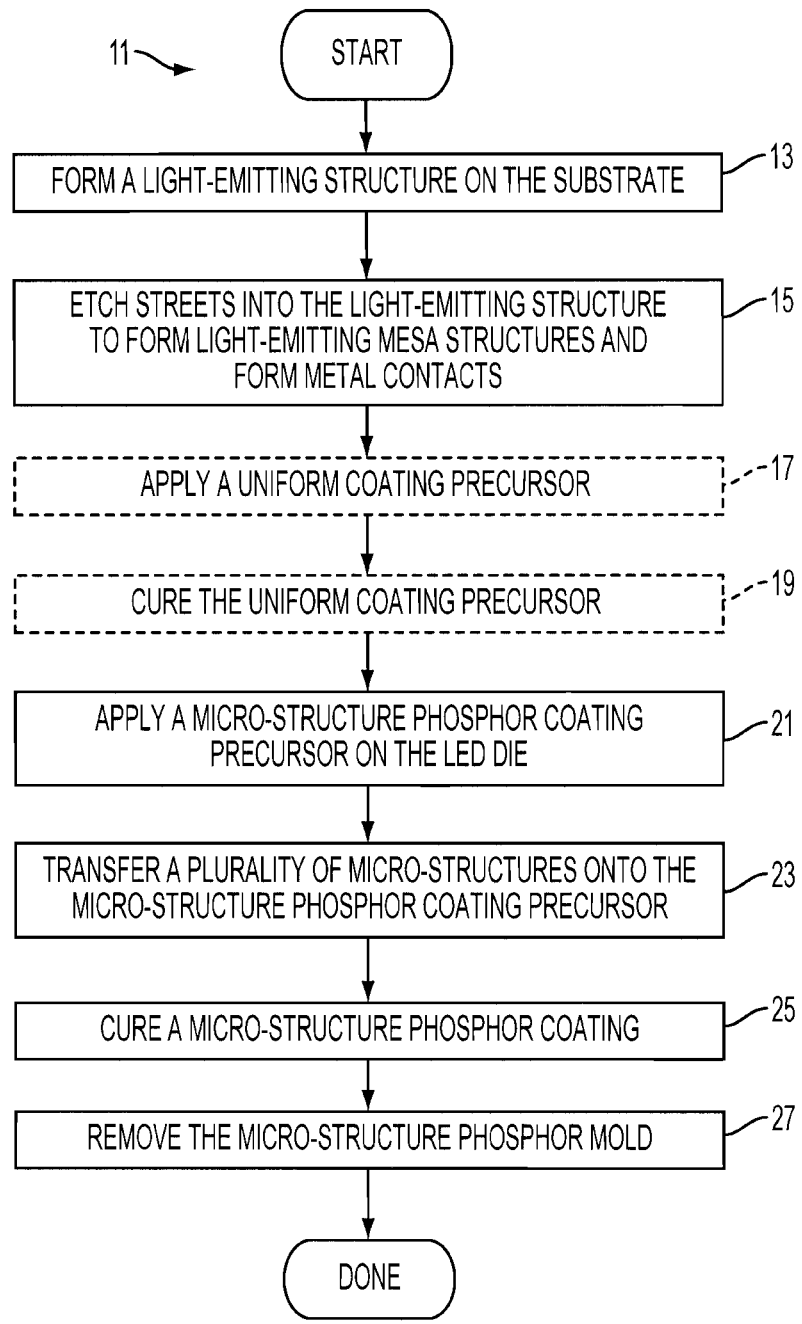
FIGS. 1A and 1B are a flowcharts illustrating methods of fabricating an optical emitter according to various embodiments of the present disclosure.

One aspect of the present invention involves an optical emitter that includes micro-structure phosphor coating on a light-emitting diode (LED) die mounted on a package substrate. The micro-structure phosphor coating is on a surface of the LED die opposite from the package substrate. The micro-structures are half spheroids, three-sided pyramids, or six-sided pyramids. A lens is attached to the package substrate and located over the layer of micro-structure phosphor coating and the LED die.

Another aspect of the present invention involves a method of fabricating an optical emitter. The method includes attaching an light-emitting diode (LED) die to a package substrate, electrically connecting the LED die and the package substrate, applying a micro-structure phosphor coating precursor on the LED die, applying a micro-structure phosphor mold over the micro-structure phosphor coating precursor on the LED die, curing a micro-structure phosphor coating through the micro-structure phosphor mold, and removing the micro-structure phosphor mold. A plurality of micro-structures is transferred onto the micro-structure phosphor coating precursor by the micro-structure phosphor mold. Alternatively, the micro-structures are transferred onto a micro-structure phosphor coating precursor by patterning and curing the precursor.

These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

A conventional optical emitter includes an LED die attached to a package substrate and a layer of phosphor material coating over the LED die. The LED die may be electrically connected to circuitry on the package substrate in a number of ways. One conventional connection method involves attaching the growth substrate portion of the die to the package substrate, and forming electrode pads that are connected to the p-type semiconductor layer and the n-type semiconductor layer in the light-emitting structure on the die, and then bond wiring from the electrode pads to contact pads on the package substrate. Another conventional connection method involves inverting the LED die and using solder bumps or other electrical bonding materials to connect the electrode pads on the light-emitting structure directly to the package substrate. Yet another conventional connection method involves using hybrid connectors. One semiconductor layer, for example the p-type layer, may be wired bonded to the package substrate while the other layer (n-type layer) may be soldered to the package substrate.

The conventional optical emitter includes one or more phosphor materials that are usually applied directly onto the LED die. Conventional methods of applying the one or more phosphor materials include spraying or dropping the phosphor material in a concentrated viscous fluid medium, for example, liquid glue, onto the surface of the LED die through which the generated light must pass. As the viscous fluid sets, or cures, the phosphor material becomes a part of the LED package. The phosphor material coating may be a conformal uniform coating or in the shape of a dome depending on the viscosity of the medium and method of application. The conventional optical emitter also includes a lens over the LED die coated with phosphor. The lens may be made of plastic, epoxy, or silicone and is attached to the package substrate by gluing its edge onto the package substrate. Usually, the lens is manufactured separately from the LED die and is available in specific sizes and shapes. Thus, in a conventional optical emitter, light generated by the LED die travels through a sapphire growth substrate if the LED is solder bonded, one or more layers of phosphor material on the die, an interior space or an encapsulant between the phosphor material and the lens, and through the lens itself.

In the case of a conformal and uniform phosphor coating, the light output from the optical emitter has different correlated color temperature (CCT) at different angles. Generally, light generation is not uniform across the LED die—more light emits from the center of the LED die in a normal direction. Given a relatively uniform phosphor concentration, the likelihood that a photon emitting from the center of the LED die in the normal direction encountering a phosphor particle is lower than that of a photon emitting elsewhere on the LED die in a different direction. The result is different CCT at different angles. Generally the CCT in the normal direction is cooler (more blue) than at more acute angles because less of the LED die output is converted to warmer colors.

In the case of a dome-shaped phosphor coating, the light output from the optical emitter also has different correlated color temperature (CCT) at different angles. The dome-shaped phosphor coating at relatively uniform phosphor concentrations increases the likelihood that a photon emitting from the center of the LED die in the normal direction would encounter a phosphor particle compared with a photon emitting elsewhere on the LED die in a different direction. Thus the absolute difference in CCT would decrease as compared to the uniform phosphor coating. However, the shape and/or thickness of the dome-shaped phosphor coating may vary from optical emitter to optical emitter due to the dispensing of viscous fluid medium. Because the dome shape is hard to control, the CCT at different angles would also vary.

Additionally, the total light output from the optical emitter using a dome-shaped phosphor coating may be lower as compared to a similar optical emitter using a uniform phosphor coating. The LED die is usually a mesa. When the light generated from a mesa passes through a dome-shaped phosphor coating, some total internal reflection (TIR) can occur, especially around the edges of the mesa. Total reflection is an optical phenomenon that occurs when a ray of light strikes a medium boundary at an angle larger than a particular critical angle with respect to the normal to the surface. If the refractive index is lower on the other side of the boundary, no light can pass through and all of the light is reflected. The critical angle is the angle of incidence above which the total internal reflection occurs. If the angle of incidence is greater (i.e., the ray is closer to being parallel to the boundary) than the critical angle—the angle of incidence at which light is refracted such that it travels along the boundary—then the light will stop crossing the boundary altogether and instead be totally reflected back internally.

In an optical emitter using a dome-shaped phosphor coating, the change in shape from a mesa-shaped source to a domed transition increases the likelihood of having an angle of incidence that produces TIR. While an optical emitter using an uniform phosphor coating also has this shape change from a mesa-shaped source (LED die and phosphor coating) to a domed transition (the lens), the geometries of the shape change is different such that the likelihood of having an angle of incidence that produces TIR while using an uniform phosphor coating is much lower. The mesa-shaped source of the optical emitter using an uniform phosphor coating is very small as compared to the lens, whereas the mesa-shaped source of the optical emitter using a dome-shaped phosphor coating is not so small as compared to the dome-shaped phosphor coating.

The optical emitter in accordance with various embodiments of the present disclosure includes micro-structure based phosphor coating on a light-emitting diode (LED) die mounted on a package substrate. The micro-structure phosphor coating is on a surface of the LED die opposite from the package substrate. The micro-structures are half spheroids or pyramids, for example, three-sided pyramids, or six-sided pyramids. A lens is attached to the package substrate and located over the layer of micro-structure phosphor coating and the LED die.

The optical emitter may also include a layer of conformal phosphor coating between the layer of micro-structure phosphor coating and the surface of the LED die that is opposite from the package substrate. The micro-structures may have a pitch of about 10-50 microns and/or a thickness of about 10-50 microns. The micro-structures on the phosphor coating may have non-uniform density and/or different shapes. The micro-structure phosphor coating may be hardened ultraviolet (UV) gel, thermal gel, or a photoresist.

In some embodiments, an optical emitter using a micro-structure phosphor coating has a better light extraction, and hence light output, over optical emitters using conventional phosphor coatings. The micro-structure phosphor coating and the LED die may be considered as a mesa-shaped source with micro-structure surface. The micro-structure phosphor coating adds surfaces oriented in different directions to scatter and diffuse the light. The various surfaces reduce likelihood of TIR because any reflected light is likely to pass through another surface. In certain embodiments, the optical emitter using a micro-structure phosphor coating also has improved angular CCT performance because the light passing through the phosphor coating is scattered and diffused.

In another aspect, various embodiments of the present disclosure involve methods of fabricating an optical emitter. Certain methods include attaching an light-emitting diode (LED) die to a package substrate, electrically connecting the LED die and the package substrate, applying a micro-structure phosphor coating precursor on the LED die, applying a micro-structure phosphor mold over the micro-structure phosphor coating precursor on the LED die, curing a micro-structure phosphor coating through the micro-structure phosphor mold, and removing the micro-structure phosphor mold. A plurality of micro-structures is transferred onto the micro-structure phosphor coating precursor by the micro-structure phosphor mold. The curing may involve exposing the micro-structure phosphor precursor to ultraviolet (UV) light or heat. The methods may also include applying a uniform coating precursor on the LED die surface. The uniform coating precursor may include phosphor material.

Alternatively, the micro-structures are transferred onto a micro-structure phosphor coating precursor by patterning and curing the precursor. A portion of the phosphor coating precursor is removed after selectively exposing the precursor to radiation, which changes the precursor material property. During the curing process, the remaining micro-structure phosphor coating precursor may change shape. The shape change may be controlled by the curing process conditions. The micro-structure phosphor coating precursor may include photoresist and phosphor. The micro-structures may be half spheroids. These various method embodiments can be integrated with semiconductor manufacturing processes and allow use of wafer-level manufacturing and packaging.

Figure 5:
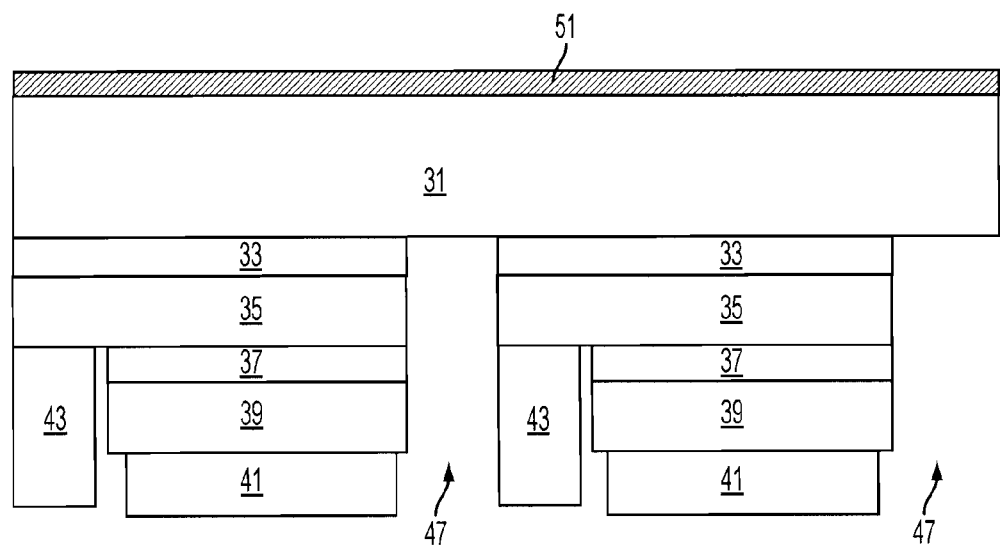
Figure 6A:
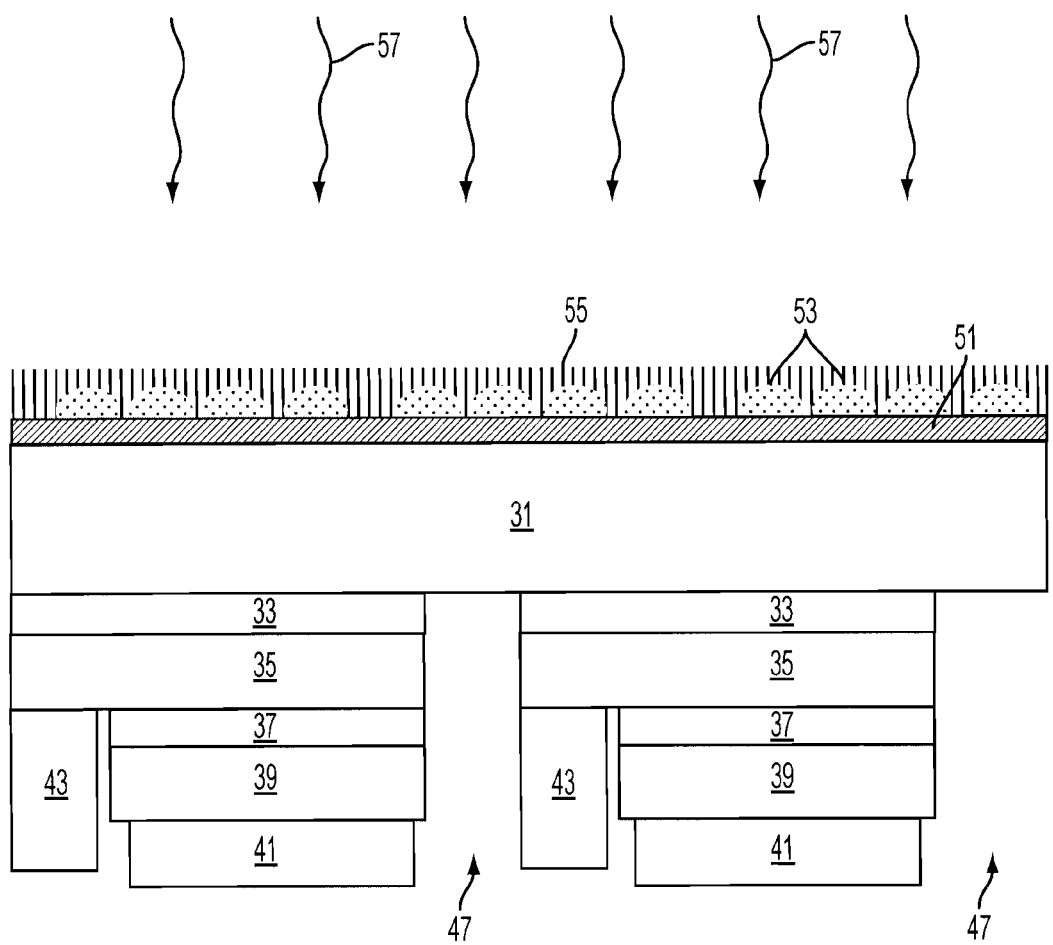
Figure 6B:
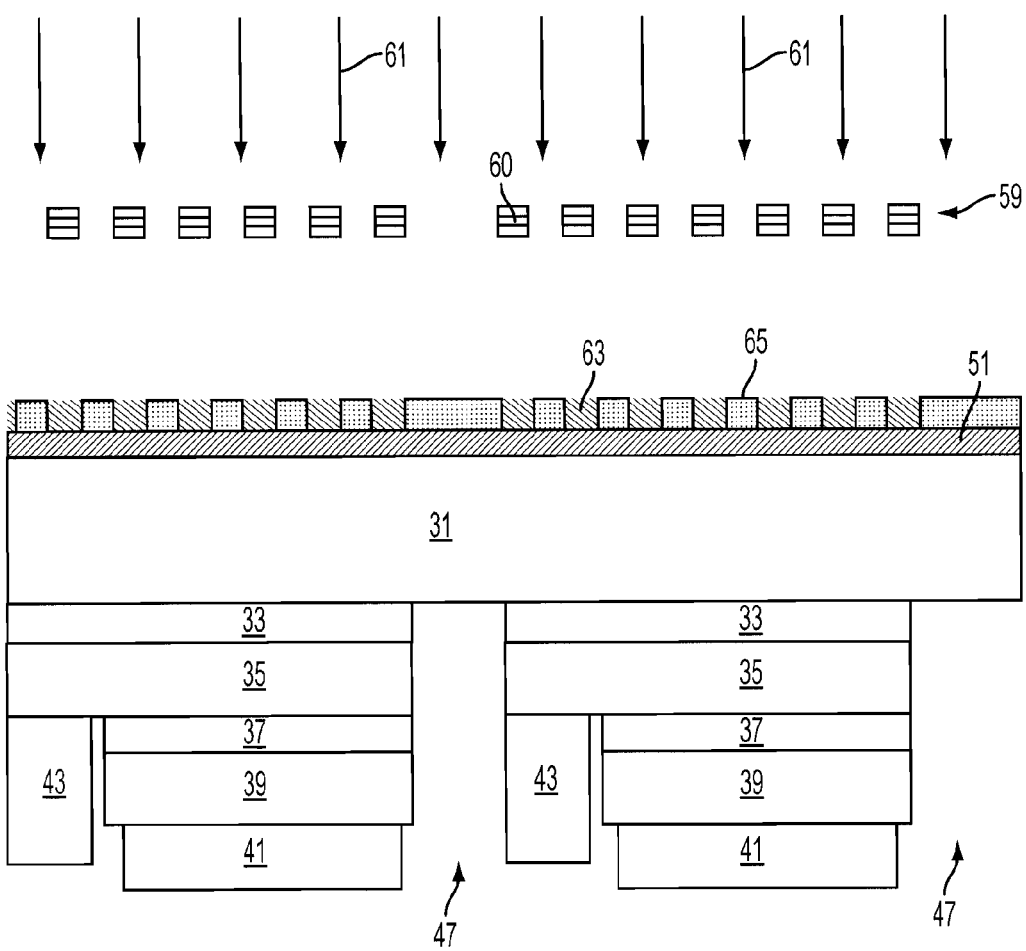
Figure 6C:
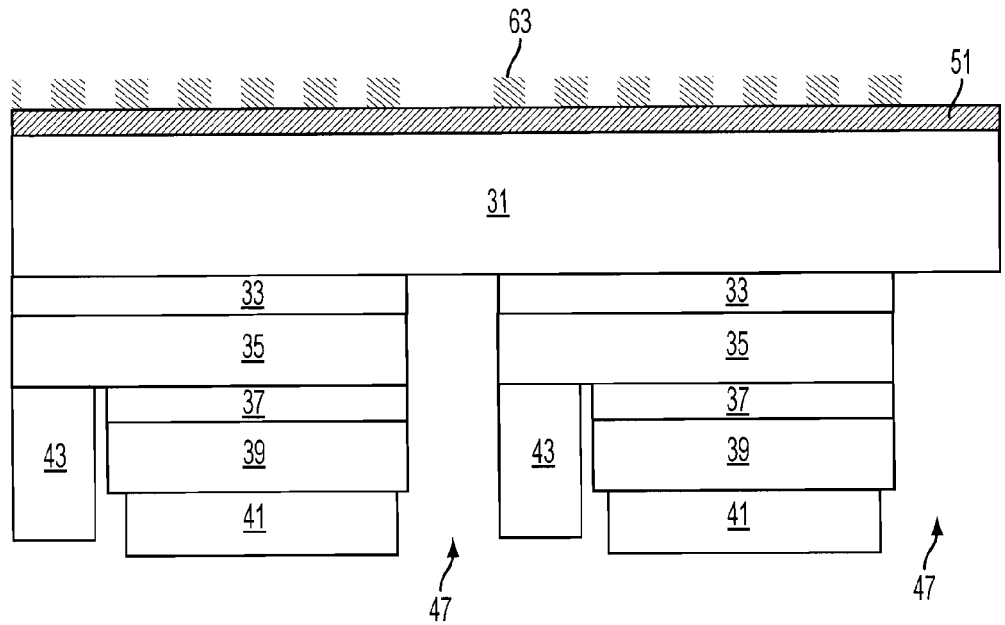
Figure 6D:
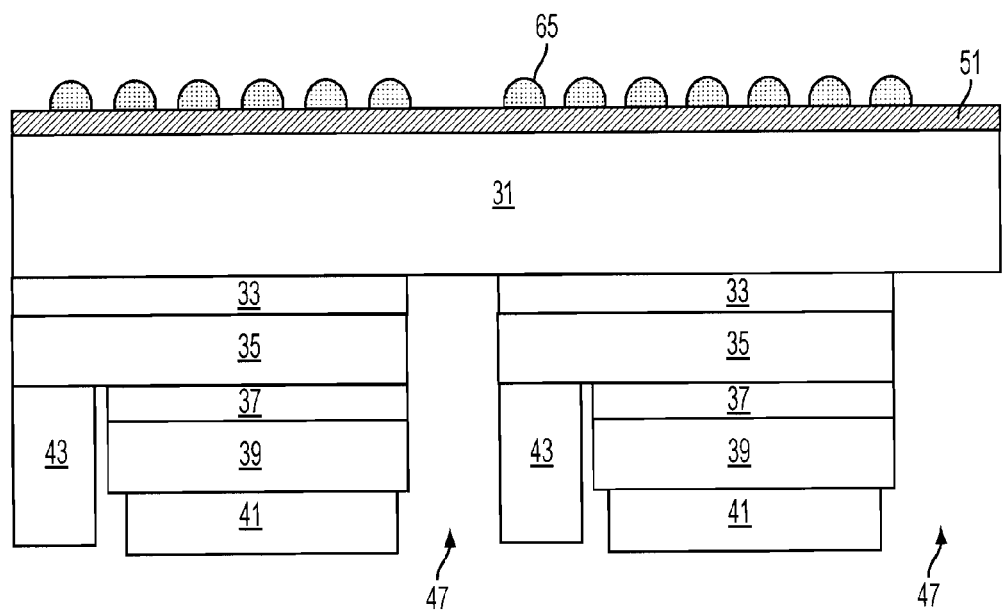
Figure 7:
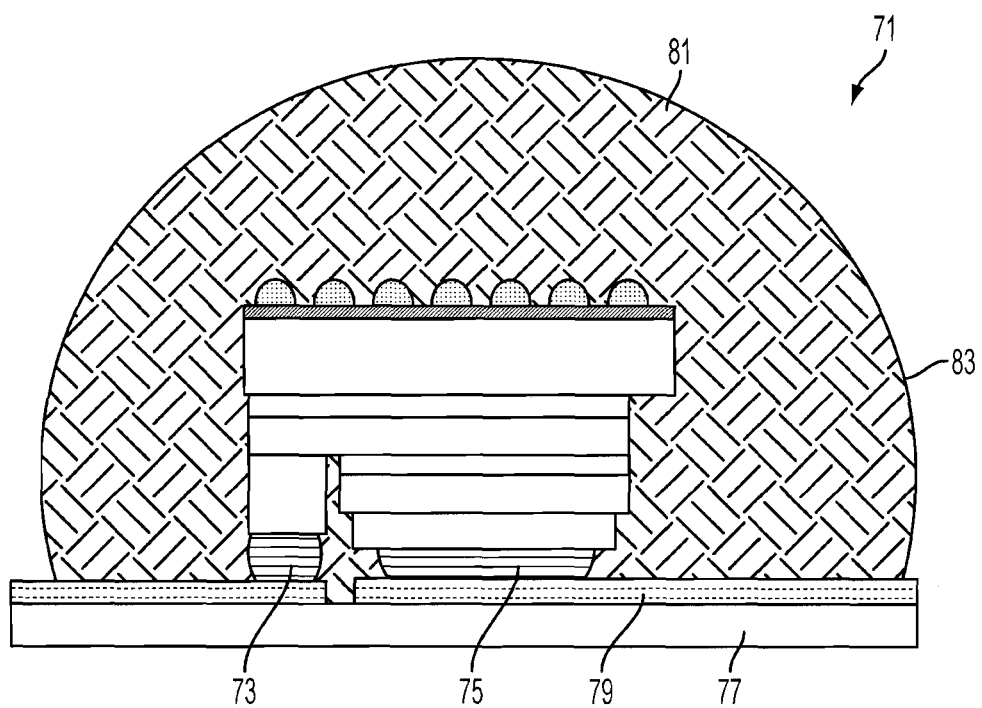

Illustrated in FIG. 1A is a flowchart of a method 11 for fabricating an optical emitter in accordance with various embodiments of the present disclosure. FIGS. 2 to 6A are diagrammatic fragmentary cross-sectional surface views of the integrated photonic device during various fabrication stages in accordance with one embodiment of the method 11 in FIG. 1A. FIG. 7 shows an example optical emitter fabricated in accordance with various embodiments of the present disclosure. The optical emitter may be a standalone device or a part of an integrated circuit (IC) chip or system on chip (SoC) that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors. It is understood that FIGS. 2-7 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIG. 1A, the method 11 begins with block 13 in which a light-emitting structure is formed on a growth substrate. The growth substrate includes a material that is suitable for growing a light-emitting structure. Thus, the substrate may also be referred to as a growth substrate or a growth wafer. In various embodiments, the substrate includes sapphire. In other embodiments, the substrate may include silicon carbide, silicon, or another suitable material for growing the light-emitting structure, which is usually a semiconductor diode capable of emitting light when electricity is conducted across it.

Figure 2:
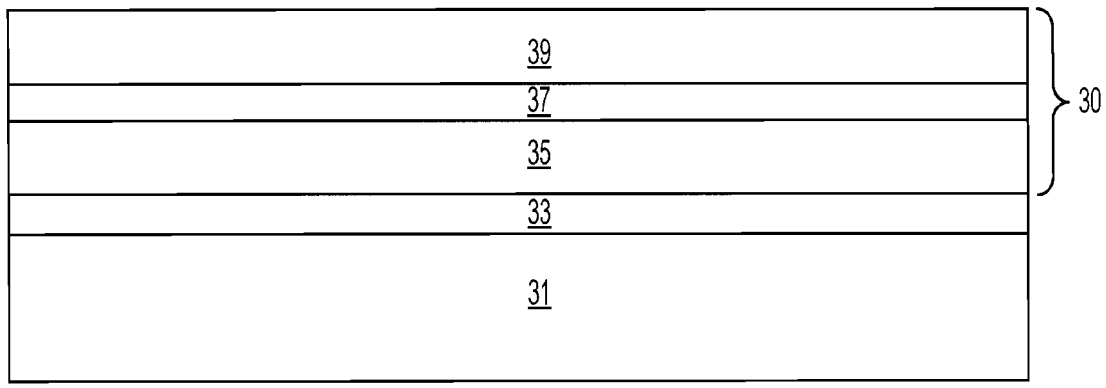
FIGS. 2-7 illustrate cross-sectional views of the optical emitter at various stages of fabrication according to various embodiments of the methods of FIGS. 1A and 1B.

FIG. 2 shows the light-emitting structure 30 on the substrate 31. An example light-emitting structure 30 includes a doped layer 35, a multiple quantum well layer (MQW) 37, and a doped layer 39. The doped layers 35 and 39 are oppositely doped semiconductor layers. In some embodiments, the doped layer 35 includes an n-type gallium nitride material, and the doped layer 39 includes a p-type material. In other embodiments, the doped layer 35 may include a p-type gallium nitride material, and the doped layer 39 may include an n-type gallium nitride material. The MQW layer 37 shown in FIG. 2 includes alternating (or periodic) layers of active material, for example, gallium nitride and indium gallium nitride. For example, in one embodiment, the MQW layer 37 includes ten layers of gallium nitride and ten layers of indium gallium nitride, where an indium gallium nitride layer is formed on a gallium nitride layer, and another gallium nitride layer is formed on the indium gallium nitride layer, and so on and so forth. The number of layers of alternating layers and their thicknesses affect the light emission efficiency. The thickness of the MQW layer 37 may be, for example, about 100-2000 nm, about 1 μm, or about 1.5 μm.

In FIG. 2, the doped layer 35, the MQW layer 37, and the doped layer 39 are all formed by epitaxial growth processes. In the epitaxial growth processes, a first undoped layer 33, usually gallium nitride and may be aluminum nitride, is grown on the substrate 31. The first undoped layer 33 is also referred to as a buffer layer 33. The buffer layer may be about 500 nm to 5 μm, for example, about 1.5 μm or about 2 μm. The layers 35, 37, and 39 are grown subsequently. The doping may be accomplished by adding impurities into a source gas during the epitaxial growth process. After the completion of the epitaxial growth process, a p-n junction (or a p-n diode) is essentially completed. When an electrical voltage is applied between the doped layer 35 and the doped layer 39, an electrical current flows through the light-emitting structure 30 and the MQW layer 37 emits radiation. The color of the light emitted by the MQW layer 37 is associated with the wavelength of the emitted radiation, which may be tuned by varying the composition and structure of the materials that make up the MQW layer 37. For example, a small increase in the concentration of indium in the indium gallium nitride layer is associated with a shift of the wavelength output toward longer wavelengths.

The operation of forming a light-emitting structure 30 may optionally include the formation of additional layers not shown in FIG. 2. For example, an ohmic contact layer or other layers may be added on the doped layer 39. These other layers may be an indium tin oxide (ITO) layer, or another transparent conductive layer.

Figure 3:
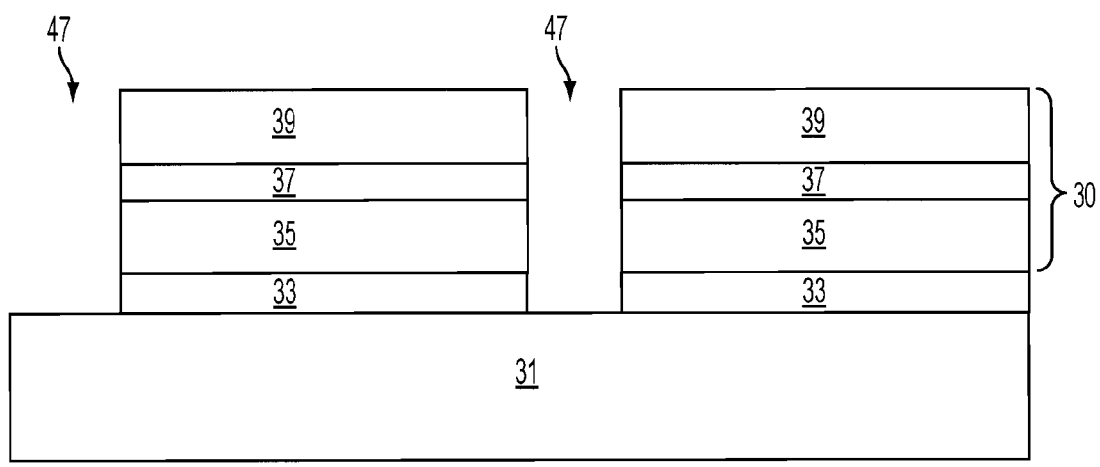

Referring back to FIG. 1A, streets (grooves) are etched into the light-emitting structure to form light-emitting mesa structures and metal contacts formed in operation 15. FIG. 3 shows the streets 47 etched to the light-emitting structure 30. The streets 47 separate individual light-emitting mesa structures. While the streets are shown as having high aspect ratios, the drawings are not to scale and in reality the streets may be much wider than they appear. The mesa structure may be a total of several microns high and hundreds or thousands of microns wide. The street width may be more than 50 microns wide. As shown, the etching that forms the streets 47 stops at about the interface between the buffer layer 33 and the doped layer 35. In various embodiments, the etch stops past the interface in the buffer layer 33, or before the interface in the first doped layer 35. The etch may stop at or past the interface of the buffer layer 33 and the doped layer 35, but leaving a portion of buffer layer 33. As is known in the art, the depth of the etching may be controlled by various process parameters such as duration or selectivity of the materials or reactants.

Figure 4:
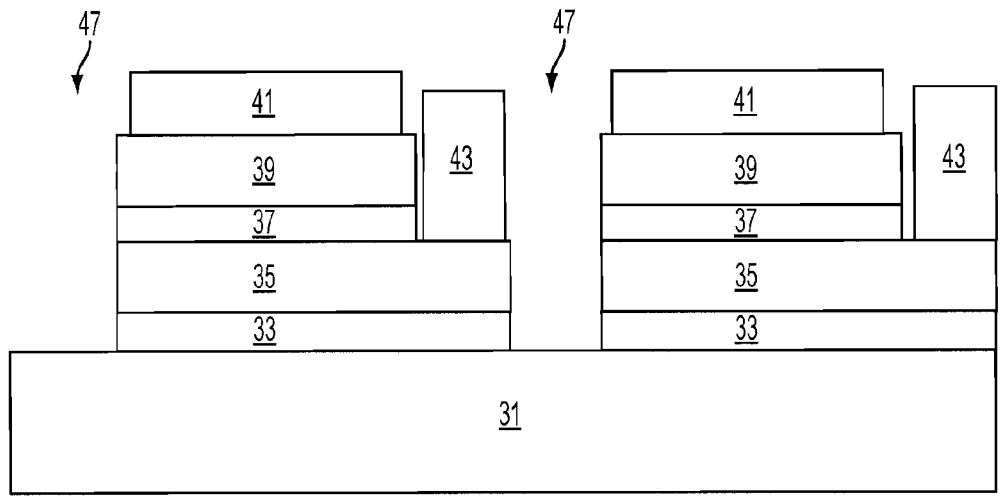

After the streets are etched, a portion of the light-emitting mesa structures may be further etched to expose a surface of doped layer 35 for a metal contact. FIG. 4 shows the light-emitting mesa structures having metal contacts 41 and 43. A metal contact layer 41 is formed over doped layer 39 and another metal contact layer 43 is formed over doped layer 35. Other conductive layers may be disposed between the metal contact layers (41 and 43) and doped layers (39 and 35). These other conductive layers may include a reflecting metal layer or a current spreading layer. The metal contact layer 41 and 43 are metals, which may be nickel, an alloy of nickel, or some other metals. In one embodiment, the metal contact layer 41 and 43 are nickel/silver alloys. The metal contact layer 41 and 43 adhere well to the top layer of the light-emitting structure 30, which may be the doped layers (39 and 35) or one of the optional other conductive layers. A reflecting metal layer may include aluminum, copper, titanium, silver, gold, alloys of these such as titanium/platinum/gold, or combinations thereof. Particularly, silver and aluminum are known to be good reflectors of blue light. The reflecting metal layer may be formed by a physical vapor deposition (PVD) process, a chemical vapor deposition (CVD), an electroplating process, or other deposition processes.

Referring back to FIG. 1A, a uniform coating precursor is applied in optional operation 17. A uniform coating precursor allows light to pass through and may include phosphor material. The uniform coating precursor may include ultraviolet (UV) gel, thermal gel, photoresist, epoxy, silicone, Poly(m-ethyl methacrylate) (PMMA), or other similar material. FIG. 5 shows a uniform coating precursor 51 applied to a backside of the growth substrate 31. The uniform coating precursor 51 may be applied by spray, dispensing, spin-on, dipping, or other methods. In this embodiment, the light-emitting mesa structure is formed on the front side of the growth substrate 51. In optional operation 19, the uniform coating precursor is cured to form a uniform coating. The curing technique depends on the precursor material. For example, UV gels are cured by exposing the coating to UV light. Some uniform coating precursor may cure under ambient conditions and no additional curing operation is needed.

A micro-structure phosphor coating precursor is applied on the LED die in operation 21 of FIG. 1A. The micro-structure phosphor coating precursor may be sprayed, dispensed, spun-on, or be dipped in as a coating in a similar process as the application of the uniform coating precursor. Then a plurality of micro-structures may be transferred onto the micro-structure phosphor coating precursor in operation 23. In this embodiment, as shown in FIG. 6A, the micro-structure phosphor coating precursor is applied over the uniform coating 51. A micro-structure phosphor coating mold 55 is applied to the micro-structure phosphor coating precursor 53 to transfer the micro-structures. By adding pressure on the micro-structure phosphor coating mold 53, micro-structure patterns on the underside of the mold is transferred into the micro-structure phosphor coating precursor by displacing a portion of the precursor into the micro-structure patterns.

The micro-structure phosphor coating is then cured in operation 25 to set so that it retains its micro-structure shapes and adheres to the underlying uniform coating or growth substrate. FIG. 6A illustrates the curing process. Radiation or other energy 57 is applied to the micro-structure phosphor coating mold that allows the radiation to pass through. The radiation 57 may be UV radiation, thermal radiation (infrared, for example), microwave, or another radiation that can cure the micro-structure phosphor coating precursor material. Gels and glue materials that cure under UV light or under heat application are commercially available. Further, thermal energy need not be applied from the top. Conductive heat energy may be applied through the package substrate or through heating of the first lens mold. The curing depends on the precursor material, and may be from a few seconds to a few minutes. The curing may take place in a controlled environment such as an inert gas environment or vacuum. After the micro-structure phosphor coating has set, then the micro-structure phosphor coating mold is removed in operation 27.

FIG. 7 illustrates an optical emitter fabricated in accordance with various embodiments of the present disclosure. After the micro-structure phosphor coating mold is removed, the light-emitting mesa structures are separated from each other at the scribe lines defined by the streets etched in operation 15. The growth substrate is diced using various known techniques including sawing or laser cutting. The optical emitter 71 of the embodiment shown in FIG. 7 is completed by forming solder bumps 73 and 75 to connect the diced portions to a package substrate 77, and adding an encapsulant 81 and lens 83 over the chip. The package substrate 77 in the embodiment shown includes a conductive layer 79 for electrically connecting the optical emitter 71 to an external power supply. In other embodiments, a conductive packaging substrate may be used and the conductive layer is not necessary. Rather, some electrical isolation would be added to electrically insulate the current paths to and from the LED metal contacts. In some cases, the encapsulant may also include some phosphor material.

Figure 1B:
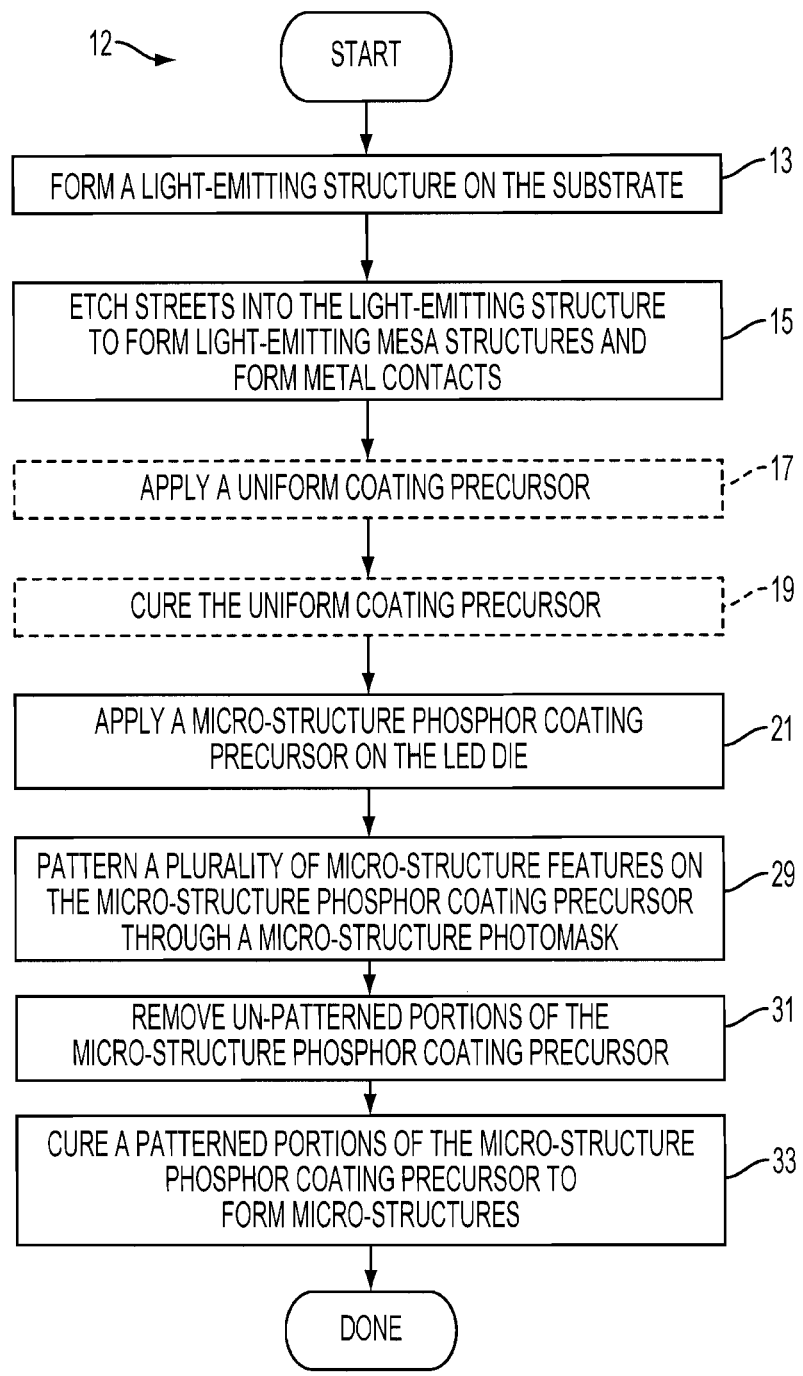

Illustrated in FIG. 1B is a flowchart of an alternate method 12 for fabricating an optical emitter in accordance with various embodiments of the present disclosure. FIGS. 2 to 5, 6B-6D are diagrammatic fragmentary cross-sectional surface views of the integrated photonic device during various fabrication stages in accordance with one embodiment of the method 12 in FIG. 1B. The operations 13 to 21 of method 12 are similar to operations 13 to 21 of method 11. Details of these operations can be found in text associated with method 11 of FIG. 1A and are not repeated here.

Referring to FIG. 1B, after a micro-structure phosphor coating precursor is applied on the LED die in operation 21, a micro-structure photomask is used to pattern a plurality of micro-structure features on the micro-structure phosphor coating precursor in operation 29. The micro-structure phosphor coating precursor is a photo-sensitive material that changes material property when exposed to radiation applied through a photomask. FIG. 6B illustrates the exposure process where radiation 61 is directed through photomask 59 having patterns 60. A portion of the radiation 61 is blocked by pattern 60 and a remaining portion of the radiation 61 reaches the micro-structure phosphor coating precursor to form a pattern 65 in the precursor. The patterns on the photomask can have varying pitches, sizes, and design depending on the final micro-structure pattern desired. For example, a pattern can include no micro-structures in the area between LED dies or alternate larger and smaller micro-structures.

A portion of the micro-structure phosphor coating precursor is then removed. The portion removed may be the un-patterned portion as in operation 31, or the patterned portion depending on the type of precursor used, i.e., a positive or negative resist. The portion of the precursor may be removed by etching as shown in FIG. 6C. The remaining portions of the micro-structure phosphor coating precursor is cured to form micro-structures in operation 33. FIG. 6D shows an example result after curing. The micro-structure precursors 63 reflow slightly and changes shape into half spheroid micro-structures 65. While half spheroids are shown, other micro-structure shapes may be fabricated using this technique.

After the micro-structures are formed, the optical emitter fabrication completes as described above with respect to FIG. 7. While FIG. 7 shows one configuration of an optical emitter fabricated in accordance with the present disclosure, other configurations can also be used within the spirit and scope of the present disclosure. For example, the optical emitter integration need not be of the flip chip variety as depicted. A vertically integrated optical emitter where the growth substrate is removed before forming the micro-structure phosphor coating can be used. In the vertically integrated optical emitter embodiments, the micro-structure phosphor coating would be applied over a doped layer or a current spreading layer.

In still other embodiments, a wire-bond integrated optical emitter is used. In the wire-bond embodiments, the micro-structure phosphor coating precursor would be applied over a side of the LED die opposite from the growth substrate and the micro-structure phosphor coating mold also define a metal contact portion where no coating is applied. The electrical contact between the LED die and the package substrate is made by wire-bonding after the micro-structure phosphor coating is formed. One skilled in the art would be able to apply the concepts of this disclosure to different optical emitter integration schemes, including integration schemes not contemplated in the current art.

Figure 8A:
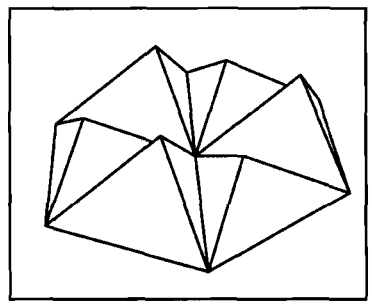
FIGS. 8A-8D illustrate micro-structures suitable for various embodiments of the present disclosure.
Figure 8B:
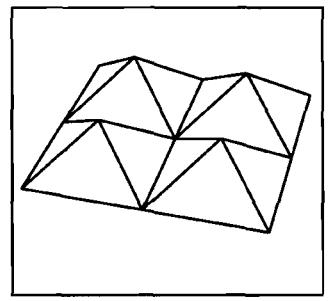
Figure 8C:
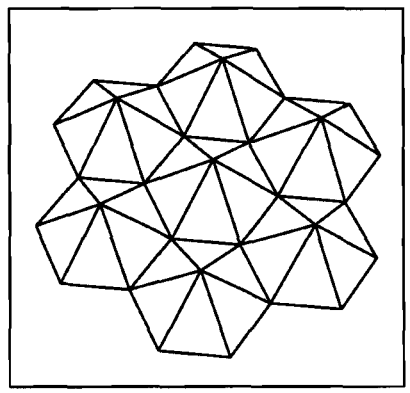
Figure 8D:
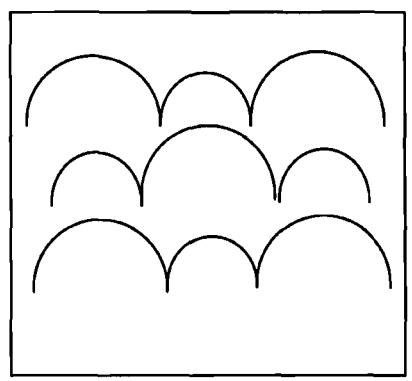

FIGS. 8A to 8D illustrate sample micro-structures. FIG. 8A shows a number of three-sided pyramids. Some pyramids are larger than others. FIG. 8B shows a number of same-sized four-sided pyramids. FIG. 8C shows a number of six-sided pyramids. FIG. 8D shows a number of half spheroids of different sizes. Suitable micro-structure and design are not limited to these. For example, micro-structure of different shapes may be mixed or have random sizes or pyramids having a number of sides different from these listed may be used.

Modeling simulations were performed with different micro-structures to evaluate the relative light extraction efficiency. The model uses a Lambertian light source, phosphor coating with different micro-structures or no micro-structure, and a lens over the light source and the phosphor coating. The micro-structures have dimensions (height and width) of approximately 10 microns with a pitch of approximately 10 microns. The light extraction efficiency was compared for micro-structures of three-sided pyramids, four-sided pyramids, six-sided pyramids, half spheroids, and no micro-structure with only a planar plate.

The planar plate coating with no micro-structure and the coating with micro-structures of four-sided pyramids performed the poorest at about 60% light extraction. The models with micro-structures of three-sided pyramids, six-sided pyramids, and half spheroids performed the best at about 95% extraction efficiency. Thus the use of these micro-structures as disclosed in accordance with various embodiments can improve overall light extraction over optical emitters that do not use micro-structures.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an optical emitter, comprising:
attaching a light-emitting diode (LED) die to a package substrate;
electrically connecting the LED die and the package substrate;
applying a micro-structure phosphor coating precursor on the LED die, wherein the micro-structure phosphor coating comprises ultraviolet (UV) gel or thermal gel;
applying a micro-structure phosphor mold over the micro-structure phosphor coating precursor on the LED die to transfer a plurality of micro-structures onto the micro-structure phosphor coating precursor;
curing the micro-structure phosphor coating, wherein the curing comprises exposing the micro-structure phosphor coating precursor to ultraviolet (UV) light through the micro-structure phosphor mold; and
removing the micro-structure phosphor mold.

2. The method of claim 1, wherein the curing a micro-structure phosphor coating comprises heating the micro-structure phosphor coating precursor.

3. The method of claim 1, wherein the micro-structures have a pitch of about 10 to 50 microns.

4. The method of claim 1, wherein the micro-structures are half spheroids, three-sided pyramids, or six-sided pyramids.

5. The method of claim 1, further comprising applying a uniform coating precursor.

6. The method of claim 5, wherein the uniform coating precursor includes phosphor material.

7. The method of claim 1, wherein the applying the micro-structure phosphor mold comprises applying pressure to the micro-structure phosphor mold such that patterns on an underside of the micro-structure phosphor mold are transferred into the micro-structure phosphor coating precursor.

8. The method of claim 1, applying the micro-structure phosphor mold comprises displacing a portion of the precursor into the micro-structure patterns.

9. The method of claim 1, wherein the LED die has a growth substrate and a mesa structure disposed on a first side of the substrate, and wherein the micro-structure phosphor coating precursor is applied to a second side of the growth substrate opposite the first side.

10. A method of fabricating an optical emitter, comprising:
attaching a light-emitting diode (LED) die to a package substrate;
electrically connecting the LED die and the package substrate;
applying a micro-structure phosphor coating precursor on the LED die, wherein the micro-structure phosphor coating precursor comprises ultraviolet (UV) gel or thermal gel;
shaping the micro-structure phosphor coating precursor into a plurality of micro-structures via a molding apparatus; and
curing the micro-structure phosphor coating precursor.

11. The method of claim 10, wherein the step of shaping includes applying a pressure to the molding apparatus to displace a portion of the micro-structure phosphor coating precursor on the LED die.

12. The method of claim 10, wherein the phosphor coating precursor is a conformal layer on the surface of the LED die opposite from the package substrate.

13. The method of claim 10, wherein a shape of the micro-structures are defined by an underside of the molding apparatus.

14. The method of claim 13, wherein the micro-structures are pyramids.

15. The method of claim 14, wherein the pyramids are three-sided.

16. The method of claim 10, wherein the curing the patterned portion comprises exposing the micro-structure phosphor coating precursor to a radiation energy through the molding apparatus.

17. A method, comprising:
coupling a light-emitting diode (LED) die to a packaging substrate, the LED die include a growth substrate and a mesa structure disposed on a first side of the growth substrate;
forming a layer over a second side of the growth substrate, the layer containing a phosphor material;

molding the layer into a plurality of micro-structures through a molding apparatus, wherein an underside of the molding apparatus defines a shape of the molded micro-structures; and curing the micro-structures.

18. The method of claim 17, further comprising removing the molding apparatus after the curing.

19. The method of claim 17, further comprising electrically coupling the LED die to the packaging substrate.

20. The method of claim 17, further comprising a uniform coating precursor over the second side of the growth substrate, and wherein the forming the layer is performed such that the layer containing the phosphor material is formed over the uniform coating precursor.

* * * * *